United States Patent [19]

Hatta et al.

[11] Patent Number: 5,255,228
[45] Date of Patent: Oct. 19, 1993

[54] SEMICONDUCTOR MEMORY DEVICE WITH REDUNDANCY CIRCUITS

[75] Inventors: Minoru Hatta, Takatsuki; Junko Hatta, Ibaraki, both of Japan

[73] Assignee: Matsushita Electronics Corporation, Osaka, Japan

[21] Appl. No.: 917,674

[22] Filed: Jul. 22, 1992

Related U.S. Application Data

[63] Continuation of Ser. No. 719,685, Jun. 25, 1991, abandoned, which is a continuation of Ser. No. 462,119, Jan. 10, 1990, abandoned.

[30] Foreign Application Priority Data

Jan. 10, 1989 [JP] Japan .................................. 1-3159

[51] Int. Cl.$^5$ ........................ G11C 8/00; G11C 11/40
[52] U.S. Cl. .................................... 365/200; 365/63;
365/225.7; 365/230.03; 365/230.06
[58] Field of Search ............... 365/63, 96, 200, 225.7,
365/230.03, 230.06; 371/10.1, 10.2, 10.3

[56] References Cited

U.S. PATENT DOCUMENTS

| | | | |
|---|---|---|---|
| 4,485,459 | 11/1984 | Venkateswaran | 365/200 |
| 4,573,146 | 2/1986 | Graham et al. | 365/200 |
| 4,599,709 | 7/1986 | Clemons | 365/200 |
| 4,603,404 | 7/1986 | Yamauchi et al. | 365/200 |

FOREIGN PATENT DOCUMENTS

| | | |
|---|---|---|
| 0085386 | 1/1983 | European Pat. Off. . |
| 2611301 | 2/1987 | France . |
| 830284 | of 0000 | PCT Int'l Appl. . |

*Primary Examiner*—Joseph L. Dixon
*Assistant Examiner*—Jack A. Lane
*Attorney, Agent, or Firm*—Wenderoth, Lind & Ponack

[57] ABSTRACT

In a memory device, if there is a defective column among the memory cell columns in the memory cell array, all of the bit lines sharing the same I/O data lines as such a defective column are separated from the I/O data line regardless of the column address, and instead a group of spare bit lines disposed corresponding to each column address and selected according to the column addresses is electrically connected to the I/O data line. In this structure, the bit lines are disposed by dividing into corresponding I/O data line, and if there are defects extending in two or more columns, as long as they are within a block of the same I/O data line, all of the defective memory cells can be replaced by the memory cells in the spare column. Therefore, while minimizing the increase of chip area and lowering of operating speed in the multiple-bit organized memories, a redundancy circuit having a high defect repair efficiency may be realized.

10 Claims, 6 Drawing Sheets

SEMICONDUCTOR MEMORY DEVICE WITH REDUNDANCY CIRCUITS

This application is a continuation of now abandoned application Ser. No. 07/719,685 filed on Jun. 25, 1991, which in turn was a continuation of now abandoned application Ser. No. 07/462,119, filed on Jan. 10, 1990 now abandoned.

BACKGROUND OF THE INVENTION

The present invention relates to a semiconductor memory device comprising a memory cell array having plural memory cells arranged in a matrix, and plural I/O data lines, and more particularly to its redundancy circuits.

The advancement of degree in the integration of semiconductor memories is notable, and in a dynamic random access memory (DRAM), a 1M bit capacity is in the mainstream. In such a large capacity random access memory, redundancy circuits are generally provided in order to lower the manufacturing cost. They dispose spare memory cells aside from the regular memory cells on the memory chip, and if a defect is found in part of the regular cells during a wafer inspection, the defective cells are replaced by the spare memory cells, thereby saving the defective chips. Practically, speaking within a memory array having plural memory cells arranged in a matrix, a spare row or a spare column for replacing the row or column containing defective memory cells, or both a spare row and a spare column are provided, and when the row address or column address of the row or column containing defective memory cells is selected, the row or column in the regular memory cell array is not selected, but the spare row or spare column is selected.

As another tendency accompanying the advancement of the degree of integration of semiconductor memory, diversification of bit organization is known. Conventionally, the DRAMs were used in a huge quantity as the main memory of a computer, it was enough with the ×1 bit organization for accessing one memory cell each time. However, as the cost per bit is lowered, the application fields of DRAMs have been expanded, and the number of memory cells that can be integrated on one chip has greatly increased, and hence there is a growing demand for a multi-bit DRAM for accessing several memory cells at a time. As a multi-bit memory, at the present, the ×4 bit organization is common in the DRAM, and the ×8 bit organization in the static random access memory (SRAM), but henceforth it is expected that memories of ×16 bit organization, ×32 bit organization and even ×64 bit organization will be required.

Examples of application of the conventional redundancy circuits in such multi-bit memory devices are shown in FIGS. 5 and 6. For the sake of simplicity, in FIGS. 5 and 6, the number of column addresses is four in ×4 bit organization. Besides, the column lines and I/O data lines are actually composed of pairs of lines including the line for complementary data, but they are expressed by one line in these examples.

In FIG. 5, bit lines (column lines) possessing common column addresses are disposed adjacently. The bit lines B1, B2, ..., B16 are regular bit lines. D1, D2, D3, D4 are I/O data lines corresponding of input/output data of 4 bits. Transistors T1, T2, ..., T16 electrically connect the regular bit lines B1 to B16 to I/O data lines D1 to D4, according to the column selection signal lines C1, C2, C3, C4 decoded and activated by a regular column decoder 10. B17, B18, B19, B20 are spare bit lines, and if there is any defect in the memory cell on any of the regular bit lines B1 to B16 electrically connectable to the I/O data lines D1 to D4, such defective bit lines are replaced by spare bit lines B17 to B20. A redundancy column decoder 20 activates the redundancy column selection signal line C5 when the column address including the defective memory cell is selected. As a result, the transistors T17, T18, T19, T20 are made to conduct, and the spare bit lines B17 to B20 are electrically connected to the I/O data lines D1 to D4. At the same time, the column selection signal line to be activated by this column address if there is no defect in the regular memory cells remains inactive. The column address for activating the redundancy column selection signal line is set up by cutting off part of the fuse preliminarily formed on the chip by a laser after discovering the defective memory cell during a wafer inspection.

FIG. 6 is an example in which the bit lines electrically connected to the same I/O data line are disposed adjacently. As shown in FIG. 6, the regular bit lines B1, B2 ..., B16 are disposed as being divided into four blocks for every corresponding I/O data line. In this case, the column decoders 10, 11, 12, 13 are disposed in each block, and according to the column address, one from each block of column selection signal lines C01, C02, C03, C04, C11, C12, C13, C14, C21, C22, C23, C24, C31, C32, C33, C34, for example, the column selection signal lines C01, C11, C21, C31 are activated. Spare bit lines B17, B18, B19, B20, and redundancy column decoders 20, 21, 22, 23 are also respectively disposed in each block. When the column address of the defective memory cell is selected, all of redundancy column selection signal lines C05, C15, C25, C35 are activated, and the transistors T17, T18, T19, T20 are made to conduct, and the spare bit lines B17, B18, B19, B20 are electrically connected to the I/O data lines D1, D2, D3, D4 respectively. At the same time, in each column decoder 10 to 13, the column selection signal line to be activated by the column address if there is no defect in the regular memory cells remains inactive.

Incidentally, the status of occurrence of defective memory cells is not completely random, but often adjacent memory cells become defective at the same time, or the adjacent bit lines are short-circuited to make two columns defective simultaneously. On the other hand, in the column redundancy circuit shown in FIG. 6, one bit line is replaced by the redundancy bit line in each block, and therefore if the adjacent upper and lower memory cells become defective at the same time, or the adjacent bit lines are short-circuited so as to be defective, it is impossible to save the memory device. Hence, the example shown in FIG. 6 is disadvantageous in that the efficiency of repair with this redundancy circuit is not as high as that of the example shown in FIG. 5.

By contrast, in FIG. 5, even if defective memory cells are present, spreading over two or more columns, it is possible to replace the cells with spare bit lines as long as they are in the range of the same column address. In the case of FIG. 5, however, since the transfer gate transistors T1, T2, ... T20 for electrically connecting the bit lines to I/O data lines are disposed so as to overlap the I/O data lines D1 to D4, the layout design is restricted, and the chip area is larger than in FIG. 6. Instead of forming the transistors beneath the I/O data line wiring region, it may be possible to connect the drains of the transistors T1 to T20 to the I/O data lines D1 to D4 with the wiring crossing the I/O data lines D1 to D4, but in the case of FIG. 5, if the arrangement so structured, it is necessary to dispose one cross wiring for each bit line, and the wiring capacitance of the I/O data lines D1 to D4 increases significantly as compared with the case in which only one cross wiring is enough for each block, and the operating speed may be significantly lowered. Such problems of increased chip area and reduction of operating speed become more and more serious when the number of bits of input or output data increases.

SUMMARY OF THE INVENTION

In order to solve the above problems, the invention comprises a redundancy circuit which replaces the bit lines to be electrically connected to a specific I/O data line with the spare bit lines, instead of replacing the bit lines having a specific column address with spare bit lines, while maintaining the same circuit and composition as in FIG. 6 for the regular memory cells because it is advantageous in layout. In other words, if there is a column having defects, all bit lines sharing the I/O data line with such column are isolated from the I/O data line regardless of the column address, and, instead, a group of spare bit lines being disposed corresponding to each column address and selected according to the column address is electrically connected to the same I/O data line.

According to this construction, the bit lines are disposed by dividing into each corresponding I/O data line, and if there are defects over two or more adjacent columns, as long as they are within the block of the same I/O data line, all defective memory cells may be replaced by the memory cells of the spare column. Therefore, while minimizing the increase of chip area and reduction of operating speed due to multi-bit organization, a redundancy circuit having a high in the efficiency of repair may be realized.

DETAILED DESCRIPTION OF THE INVENTION

Figure 1:
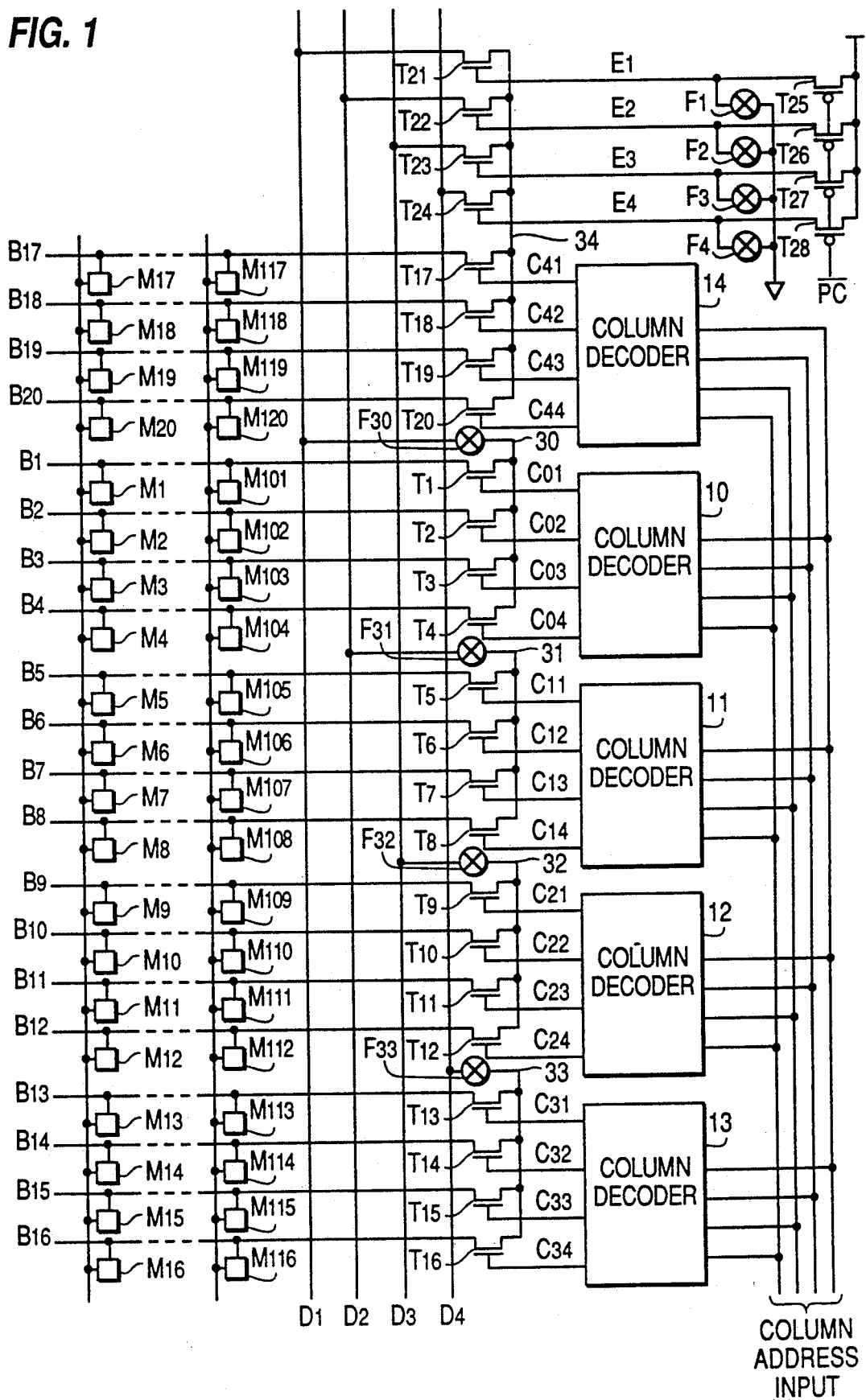
FIG. 1 is a circuit diagram of a semiconductor memory device according to a first embodiment of the present invention.

A first embodiment of multi-bit organized semiconductor memory of the invention is shown in FIG. 1. In FIG. 1, too, as in FIG. 5, FIG. 6 and the explanation is simplified by presenting a ×4 bit organization with four column addresses. In FIG. 1, the bit lines B1, B2 . . . , B16 are divided into four blocks according to each corresponding I/O data line, and four bit lines corresponding to each one of four column addresses are disposed in each block. Regular memory cells M1 to M16 and M101 to M116 are connected to the bit lines B1 to B16 as shown in FIG. 1. Therefore, when a certain column address is selected by column decoders 10, 11, 12, and 13 disposed in each block, one from each block of column selection signal lines C01, C02, C03, C04, C11, C12, C13, C14; C21, C22, C23, C24, C31, C32, C33, and C34, for example, column selection signal lines C01, C11, C21, and C31 are selected and activated. As a result, of the transfer gate transistors T1, T2, . . . , T16, the transistors T1, T5, T9, T13 having the activated column selection signal lines connected to their gates are made to conduct, and the bit lines B1, B5, B9, B13 are electrically connected to the block I/O data lines 30, 31, 32, and 33. The block I/O data lines 30, 31, 32, 33 are electrically connected to I/O data lines D1, D2, D3, and D4 respectively through fuses F30, F31, F32, and F33.

B17, B18, B19, and B20 are spare bit lines, one each corresponding to the four column addresses, totaling to four, in the same fashion in one block of the regular bit lines B1 to B16. Spare memory cells M17 to M20 and M117 to M120 are connected to the spare bit lines B17 to B20 as shown in FIG. 1. The block of the spare bit lines B17 to B20 also possesses a column decoder 14, and when a certain column address is selected, one of the column selection signal lines C41, C42, C43, and C44, for example, column selection signal line C41 is selected. In consequence, of the transfer gate transistors T17, T18, T19, and T20, the transistor T17 connected to the column selection signal line C41 at its gate is made to conduct, and the spare bit line B17 is electrically connected to the block I/O data line 34 in the spare bit line block.

In the regular bit lines, if defects are found in the memory cells (e.g. M1, M101) electrically connected to, for example, bit line B1, the fuse F30 connecting between the I/O data line D1 and block I/O data line 30 is blown by laser beam radiation. As a result, the regular memory cells (e.g. M1, M101) are not electrically connected to the I/O data line D1. Instead, accordingly, the fuse F1 is also blown, and of the transfer gate transistors T21, T22, T23, and T24, the transistor T21 between the I/O data line D1 and the block I/O data line 34 in the spare block is made to conduct, while the other transistors T22, T23, T24 are kept in a non-conducting state. Thus, the block of the bit lines B1, B2, B3, and B4, including the bit line B1 having defective memory cells is replaced by the block of spare bit lines B17, B18, B19, B20, so that this memory chip can operate normally on the whole. The gate potentials E1, E2, E3, and E4 of the transistors T21, T22, T23, and T24 electrically connecting selectively the block I/O data line 34 in the spare block and the I/O data lines D1, D2, D3, and D4 are usually maintained at the ground level by the fuses F1 to F4, and the transistors T21, T22, T23, and T24 are in a non-conducting state However, when the fuse F1 between the gate and ground of the transistor T21 is blown, the gate potential E1 of the transistor T21 is precharged to the supply voltage level when the transistor T25 is made to conduct by the precharge signal $\overline{PC}$ during the precharge period of the memory, and this voltage is maintained thereafter, so that the transistor T21 is always in a conducting state. As a result, the spare bit lines B17, B18, B19, and B20 are electrically connected to the I/O data line D1 through the transfer gate transistor T21 which is controlled by the column selection transfer gate transistors T17, T18, T19, and T20 and fuse F1 according to the column address, so as to replace the bit lines B1, B2, B3, and B4 containing defective memory cells.

In the foregoing explanation, it is assumed that there are defects in the memory cells electrically connected to the bit line B1, but if there are defective memory cells in the bit lines B2, B3 or B4, or in two or more of them, quite similarly, the defective bit lines may be replaced by the spare bit lines by blowing the fuses F1 and F30, so that a memory chip operating normally may be obtained. More generally speaking, whichever of the regular bit lines B1, B2, ..., B16 may be defective, as long as the defects are within one block, the defects may be repaired by blowing two proper fuses.

As is clear from the description herein, according to the first embodiment of the present invention, while the memory cell array of multi-bit organized semiconductor memory device is arranged by dividing into blocks in each bit group of input/output data having the layout advantage, it is possible to obtain a redundancy circuit which has a high repair efficiency and is capable of repairing defects occurring in plural columns which occur at a high incidence. In the conventional method of replacing the bit lines of a specific column address, the repair efficiency may be enhanced by replacing the plural column address with spare bit lines in each block. If thus composed, however, since plural spare bit lines may be provided in each block, the chip size increases and finally the manufacturing cost is raised. In particular, when the number of bits of input/output data is similar to or superior to the number of column addresses, the chip area is smaller and the defect repair efficiency is higher by employing the redundancy circuit of the present invention, and the manufacturing cost is significantly lowered.

Incidentally, in the embodiment in FIG. 1, fuses F1 to F4 are connected between the gate electrodes of the transfer gate transistors T21 to T24 and ground. When one of these fuses is blown, a supply voltage Vcc is applied to the gate electrode of the transistor corresponding to that fuse, and this transistor is made to conduct, thereby connecting the bit line and data line.

In such construction, however, the gate potential of the transistor in its conductive state is in a floating state, and it is susceptible to the effects of noise.

Figure 2:
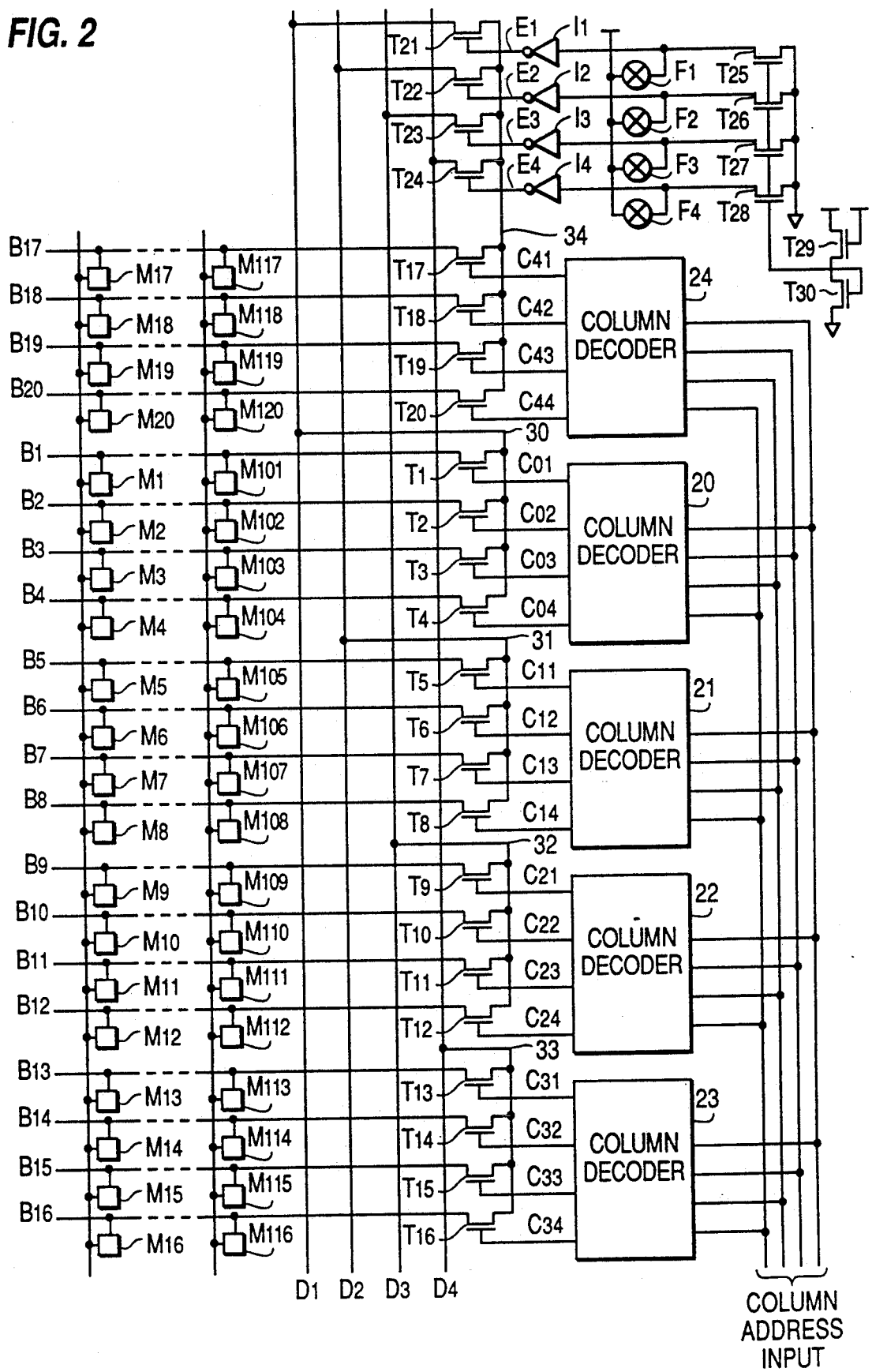
FIG. 2 is a circuit diagram of a semiconductor memory device according to a second embodiment of the present invention.

FIG. 2 shows a second embodiment of the present invention which solves such a problem.

In FIG. 2, those elements which are the same as those shown in FIG. 1 are identified with the same reference number and are not particularly explained herein, and only the elements which are different from those of FIG. 1 are described in detail.

In FIG. 2, a voltage generator circuit composed of transistors T29 and T30 generates a voltage slightly higher than the threshold voltage of the transistor. Since this voltage is applied to the gate electrode of the transistors T25 to T28, the transistors T25 to T28 possess a high resistance. Inverters I1 to I4 are connected between the drain electrodes of the transistors T25 to T28 and the transfer gate transistors T21 to T24. Fuses F1 to F4 are connected between the drain electrodes of the transistors T25 to T28, and the supply voltage Vcc.

The operation in FIG. 2 is explained below.

Figure 3:
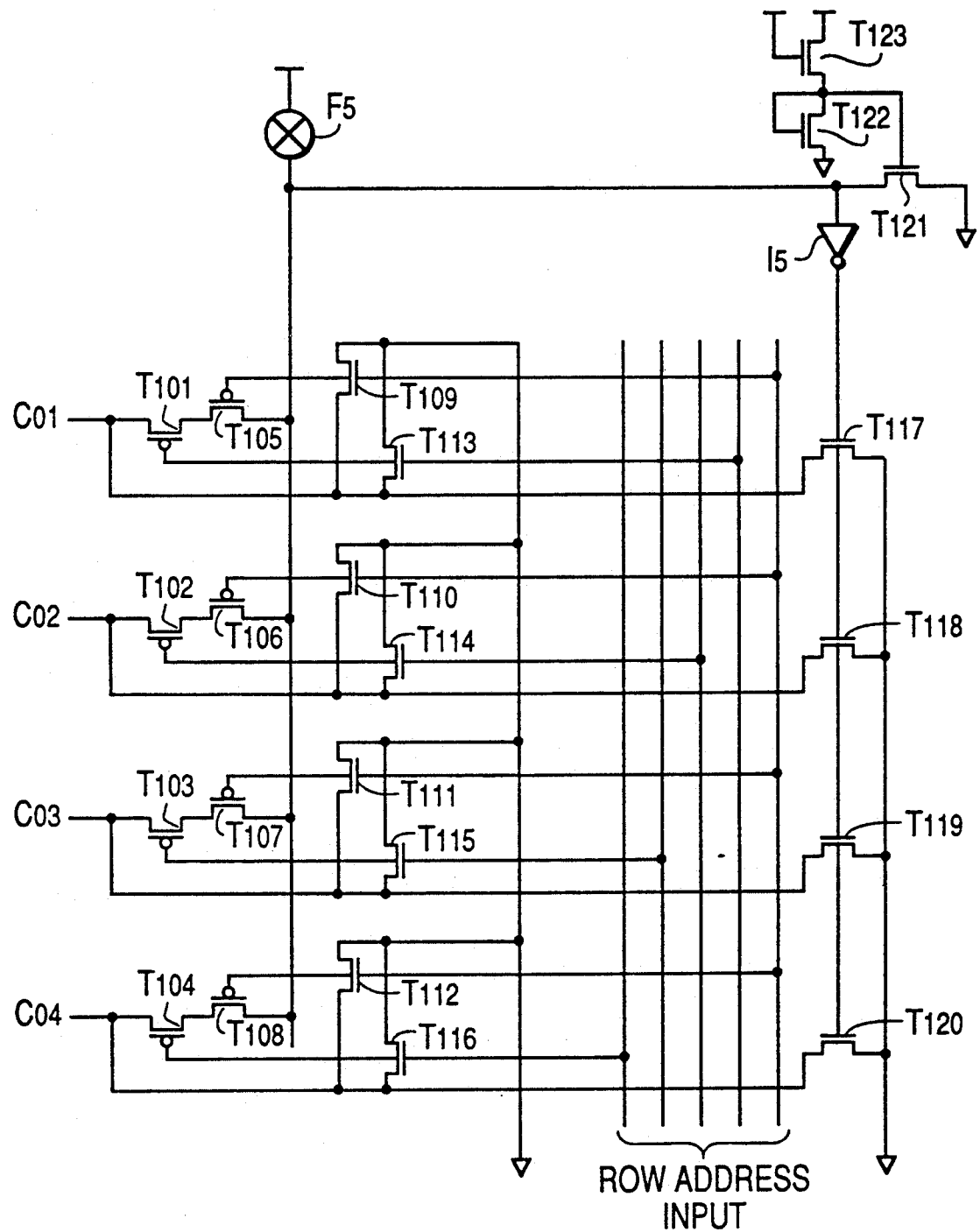
FIG. 3 is a circuit diagram of a semiconductor memory device according to a third embodiment of the present invention.

While there is no defect in the regular memory cells M1 to M16, all fuses F1 to F4 are connected. Accordingly, the input side potential of the inverters I1 to I4 in FIG. 3 is nearly equal to the supply voltage Vcc. Therefore, the gate potentials E1 to E4 of the transistors T21 to T24 are at ground potential, and the transistors T21 to T24 are in a non-conducting state, and the redundancy circuit does not operate.

On the other hand, if there are defects in any of the regular memory cells M1 to M16, for example, if the memory cells M1 and M101 connected to the bit line B1 are defective, then the fuse F1 shown in FIG. 2 is blown. When this fuse F1 is blown, the input potential of the inverter I1 is at ground level, and the output potential of the inverter I1 becomes nearly equal to the supply voltage Vcc, so that the transfer gate transistor T21 is made to conduct. Accordingly, the block of the bit lines B1, B2, B3, and B4 including the bit line B1 containing the defective memory cells M1 and M101 is replaced by the block of spare bit lines B17, B18, B19, and B20, so that the memory device can operate normally on the whole.

Thus, according to the second embodiment of the invention, when any one of the fuses F1 to F4 is blown, the gate electrode of the corresponding one of the transfer gate transistors T21 to T24 is connected to the ground by way of the inverters I1 to I4 and transistors T25 to T28. In other words, the gate potentials of the transfer gate transistors T21 to T24 are fixed at a specific potential at a high level. Accordingly, the gate potentials will not be in a floating state as experienced in the embodiment in FIG. 1, so that a stable operation less influenced by noise may be expected.

Meanwhile, in the embodiment in FIG. 1, the memory device is designed to select the bit lines connected to the left side of each column decoder by the column decoders 10 to 14, while in the actual memory device, sometimes, the same bit lines and memory cells as those shown at the left side of the column decoders 10 to 14 are symmetrically connected also at the right side of the column decoders 10 to 14. In such a memory device, as shown in the embodiment in FIG. 1, when fuses F30, F31, F32, F33 are connected correspondingly to the column decoders, the fuses must be disposed at both right and left sides of the column decoders, and the number of fuses increases. Besides, in the construction in FIG. 1, since the fuses F30 to F33 are connected to the block I/O data lines 30 to 33, the electrical characteristic of the memory device is likely to be influenced by the fuses F30 to F33.

FIG. 3 shows a third embodiment of the present invention which solves such problem. FIG. 3 shows the internal structure of one column decoder (the column decoder 20 in FIG. 2).

In FIG. 3, transistors T101 to T116 compose a column decoder circuit. Column selection signal lines C01 to C04 are connected to ground through transistors T117 to T120. A voltage generator circuit composed of transistors T122 and T123 generates a voltage slightly higher than the threshold voltage of the transistor. Since this voltage is applied to the gate electrode of the transistor T121, the transistor T121 has a high resistance. A fuse F5 is connected between the column decoder circuit and transistor T121 and supply voltage Vcc. The drain potential of the transistor T121 is applied to the gate electrodes of the transistors T117 to T120 through inverter I5.

The operation of FIG. 3 is explained below.

If there is no defect in the regular memory cells, the fuse F5 is connected. Accordingly, the input potential of the inverter I5 is nearly equal to the supply voltage Vcc, and the output potential of the inverter I5 is at a ground level. Therefore, transistors T117 to T120 are in a non-conducting state.

On the other hand, if there is defect in the regular memory cells, the fuse F5 is blown. As a result, the input potential of the inverter I5 becomes nearly equal to the ground level, and the output potential of the inverter I5 becomes nearly equal to the supply voltage. Consequently, all of the transistors T117 to T120 are in a conducting state, and all of the column selection signal lines C01 to C04 are set to the ground level as a batch, regardless of the column address having defective memory cells. As a result, all of the transfer gate transistors T1 to T4 for connecting the bit lines B1 to B4 to the I/O data line D1 corresponding to the column decoder 20 are in a non-conducting state.

Thus, according to the embodiment in FIG. 3, the fuse F5 is connected between the column decoder circuit and power supply, and is not connected to the block I/O data line. Accordingly, the electrical characteristics of the memory device is not influenced by the fuse F5. Besides, when circuits symmetrical to the memory cells, bit lines and column selection lines shown in FIG. 2 are further connected at the right side, and the memory device is designed to select the right and left bit lines by one column decoder, the right and left bit lines may be electrically cut off by only blowing one common fuse F5.

Incidentally, a special memory device for image processing, uses two kinds of column addresses, and feeds plural data bits by using first column addresses, and specifies the bits of the data by the second column addresses. In such a memory device, when the conventional method is applied to the first column address, that is, when the redundancy circuit is designed to replace the columns having a specific column address with spare columns, the spare columns must have all the column addresses, one for each column, as to the second column addresses, and it was impossible in the conventional method to realize the column redundancy circuit functioning effectively to either column address.

Figure 4:
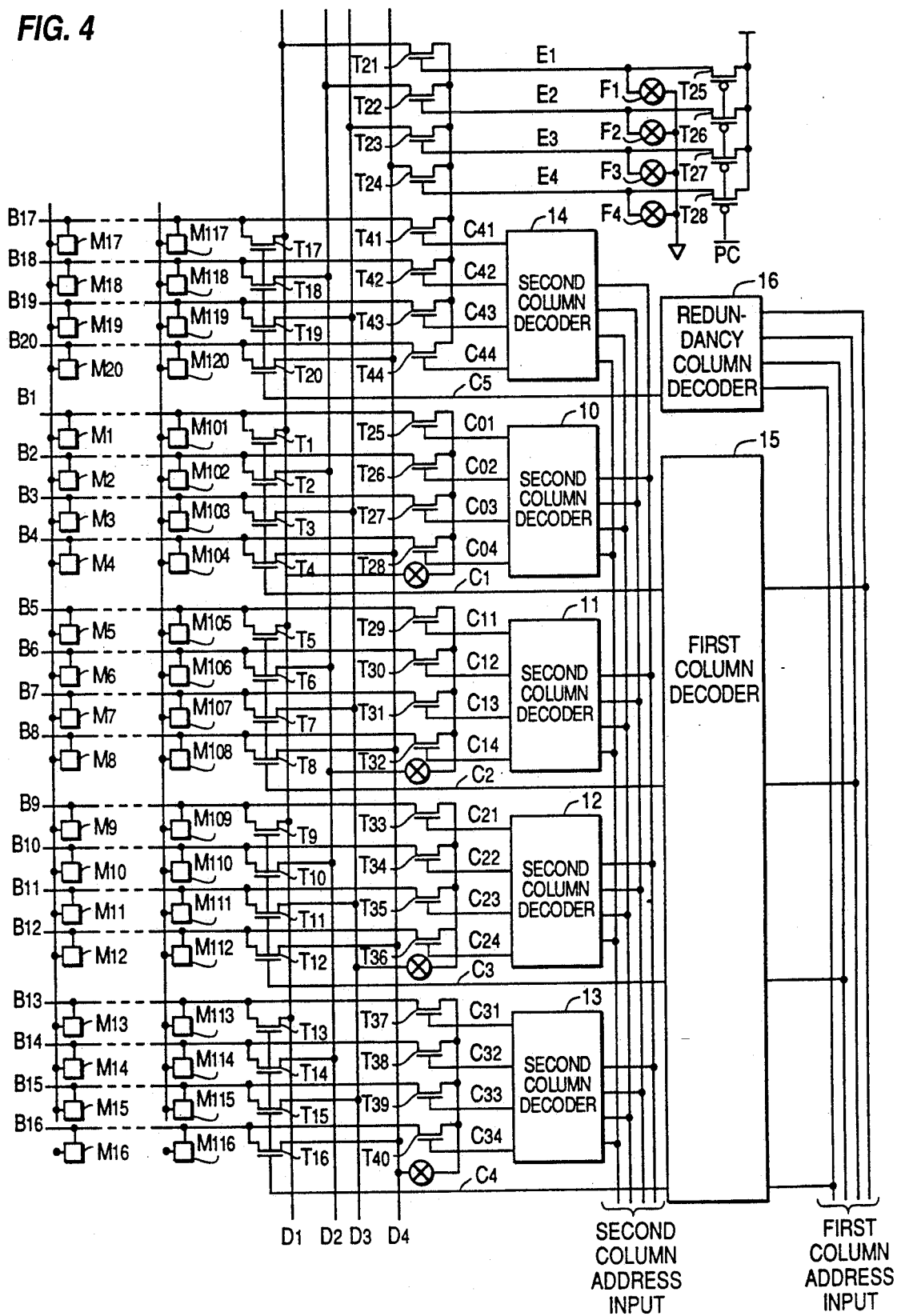
FIG. 4 is a circuit diagram of a semiconductor memory device according to a fourth embodiment of the present invention.

FIG. 4 shows a fourth embodiment of the present invention for solving such a problem.

Figure 5:
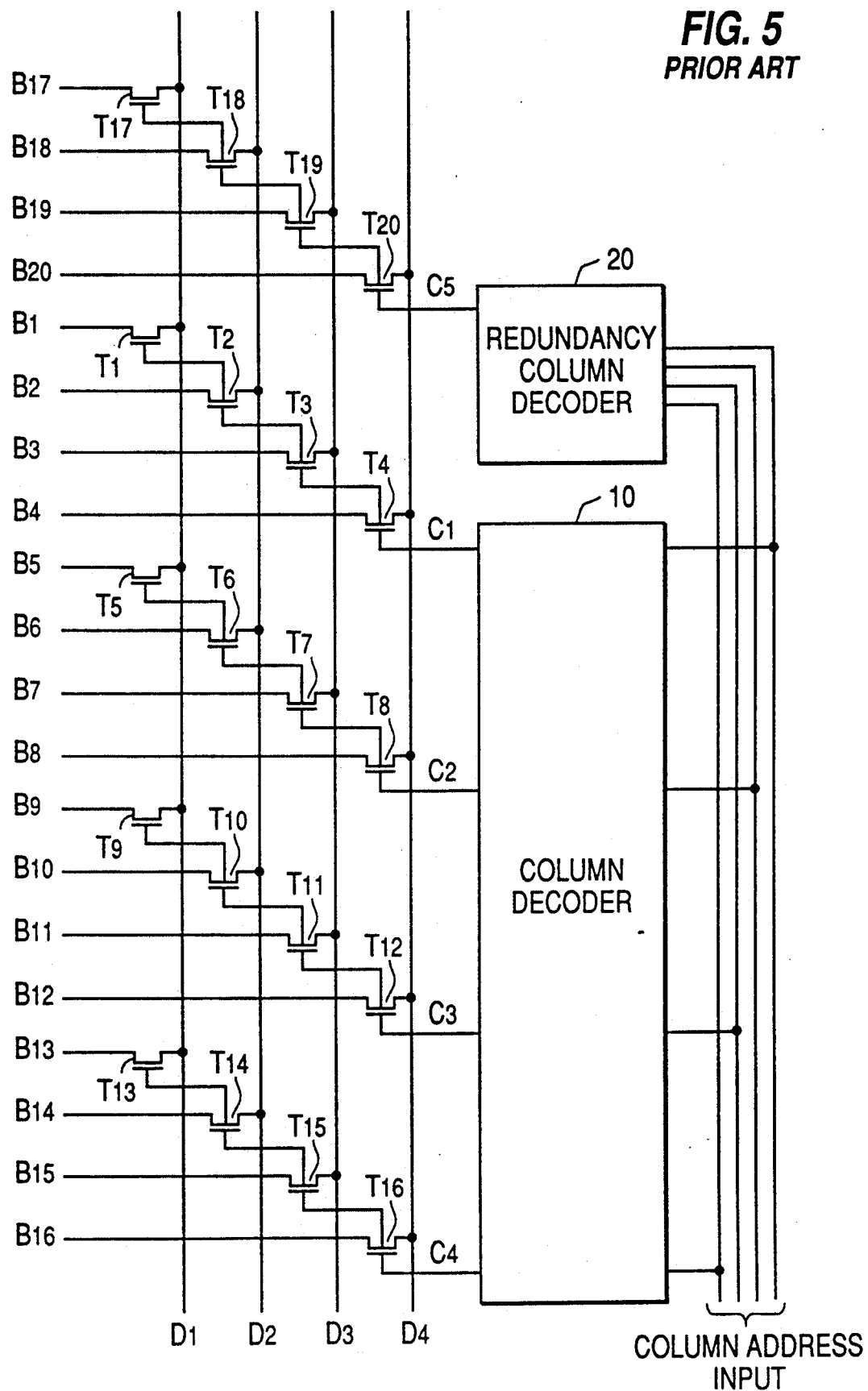
FIG. 5 and FIG. 6 are circuit diagrams of conventional semiconductor memory devices.
Figure 6:
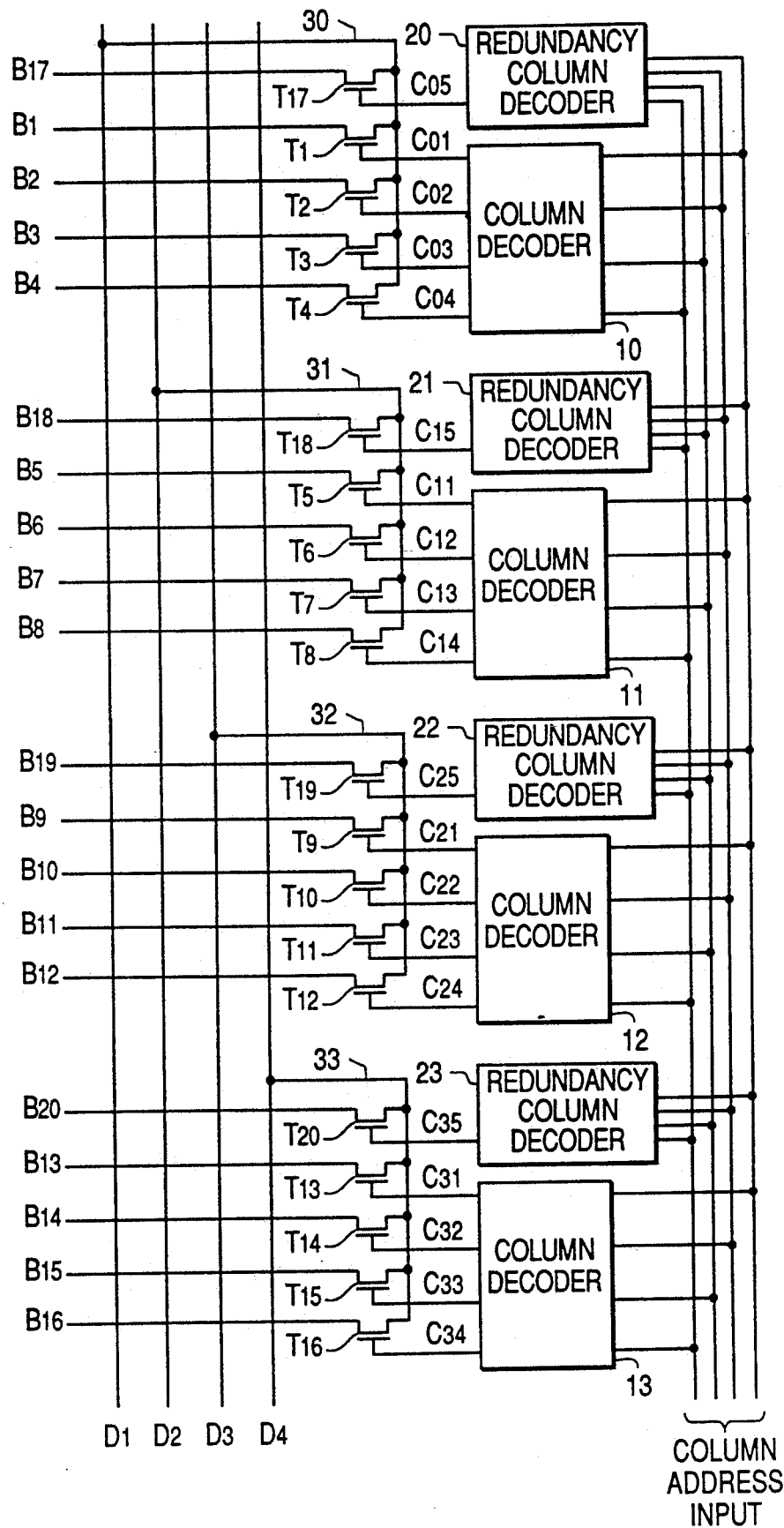

FIG. 4 is a combination of the conventional redundancy circuit shown in FIG. 5 and the redundancy circuit of the first embodiment shown in FIG. 1.

The first column addresses are fed to a first column decoder 15. Concerning these first column addresses, a redundancy circuit using a redundancy column decoder 16 is realized. This is same as the conventional redundancy circuit shown in FIG. 5. The second column addresses are fed to the second column decoders 10, 11, 12, and 13. Concerning these second column addresses, the circuit shown in the upper part of FIG. 4, that is, the same redundancy circuit as in the embodiment in FIG. 1 is added.

Thus, according to the embodiment in FIG. 4, it is possible to add a redundancy circuit to a memory device possessing two kinds of column addresses.

Meanwhile, the redundancy circuit portion of the embodiment in FIG. 4 may be replaced by the redundancy circuit shown in the embodiment in FIG. 2, or, needless to say, the internal structure of the second column decoders 10 to 14 in the embodiment in FIG. 4 may be constructed in the same fashion as in the embodiment shown in FIG. 3.

We claim:

1. A semiconductor memory device comprising:
   a memory cell array having plural memory cells arranged in rows and columns, wherein each of said columns has a column address assigned to it such that N columns (N being an integer not less than 2) out of N×M columns (M being an integer not less than 2) share a common column address out of M column addresses;
   N I/O data lines which are simultaneously connectable to respective N columns of a common column address;
   N×M first transfer gates, each having a terminal connected to a respective one of said N×M columns, and each being closed so as to allow a flow of current therethrough when an associated column is selected in response to column selection signals generated from column address input signals;
   M spare columns, each having a different column address out of said M column addresses assigned thereto;
   M second transfer gates, each having a terminal connected to each one of said M spare columns, and each being closed so as to allow a flow of current therethrough when an associated spare column is selected in response to column selection signals generated from said column address input signals;
   N first conductive lines connected to other terminals of said N×M first transfer gates such that M of said N×M first transfer gates coupled to a common I/O data line with respective M column addresses have their other terminals connected to a respective one of said N first conductive lines;
   N fusible links respectively connected between said N I/O data lines and said N first conductive lines;
   a second conductive line connected to other terminals of said M second transfer gates; and
   N electrical connecting means, each for electrically connecting each one of said N I/O data lines to said second conductive line as programmed.

2. A semiconductor memory device according to claim 1, wherein said N electrical connecting means comprise fusible links.

3. A semiconductor memory device according to claim 1, wherein each of said N electrical connecting means comprises:
   a transfer gate transistor;
   a means for applying a certain voltage to the gate electrode of said transfer gate transistor; and
   a fusible link connected between said gate electrode of said transfer gate transistor and a reference potential point.

4. A semiconductor memory device according to claim 1, wherein each of said N electrical connecting means comprises:
   a transfer gate transistor;
   a means for applying a certain voltage to the gate electrode of said transfer gate transistor through an inverter;
   a fusible link connected between an input of said inverter and a supply potential point; and
   a high resistance element connected between said input of said inverter and a reference potential point.

5. A semiconductor memory device comprising:
   a memory cell array having plural memory cells arranged in rows and columns, wherein each of said columns has a column address assigned to it such that N columns (N being an integer not less than 2) out of N×M columns (M being an integer not less than 2) share a common column address out of M column addresses;

N I/O data lines which are simultaneously connectable to respective N columns of a common column address;

N×M first transfer gates connected respectively between said N×M columns and associated I/O data lines, each being closed so as to allow a flow of current therethrough when an associated column is selected in response to column selection signals generated from column address input signals;

M spare columns, each having a different column address out of said M column addresses assigned thereto;

M second transfer gates, each having a terminal connected to each one of said M spare columns, and each being closed so as to allow a flow of current therethrough when an associated spare column is selected in response to column selection signals generated from said column address input signals;

a conductive line which is connected to other terminals of said M second transfer gates;

N electrical connecting means, each for electrically connecting each one of said N I/O data lines to said conductive line as programmed; and N control means, each for controlling M column selection signals associated with M columns, out of said N×M columns, coupled to a common I/O data line, wherein each of said N control means comprises: a column decoder circuit including input terminals for receiving said column address input signals, M output terminals coupled to said M column selection signals, and a power supply terminal; a fusible link connected between a supply potential point and said power supply terminal; M pull-down transistors having their drain terminals connected respectively to said M output terminals, having their source terminals connected to a reference potential point, and having their gate terminals connected to a disabled signal line; and a means responsive to blowing said fusible link for activating said disable signal line.

6. A semiconductor memory device comprising:

a memory cell array having plural memory cells arranged in rows and columns, wherein each of said columns has a first column address and a second column address assigned to it such that N columns (N being an integer not less than 2) out of N×N columns share a common first column address out of N first column addresses and that each said N columns of a common first column address have N second column addresses respectively assigned to them;

N I/O data lines which are simultaneously connectable to respective N columns of a common first column address or respective N columns of a common second column address;

N×N first transfer gates connected respectively between said N×N columns and associated I/O data lines with regard to first column addresses, each being closed so as to allow a flow of current therethrough when an associated column is selected in response to first column selection signals generated from first column address input signals;

N×N second transfer gates, each having a terminal connected to each one of said N×N columns, and each being closed so as to allow a flow of current when an associated column is selected in response to second column selection signals generated from second column address input signals;

N spare columns, each having a different second column address out of said N second column addresses assigned thereto and having a common specific first column address assignable thereto by programming a programmable column decoder;

N third transfer gates connected respectively between said N spare columns and said N I/O data lines, being closed so as to allow a flow of current therethrough when said specific first column address is selected in place of N first transfer gates associated with said specific first column address, in response to said first column selection signals generated from first column address input signals;

N fourth transfer gates, each having a terminal connected to each one of said N spare columns, and each being closed so as to allow a flow of current therethrough when an associated spare column is selected in response to second column selection signals generated from said second column address input signals;

N first conductive lines which are connected to other terminals of said N×N second transfer gates such that N of said N×N second transfer gates coupled to a common I/O data line with respective N second column addresses have their other terminals connected to a respective one of said N first conductive lines;

N fusible links respectively connected between said N I/O data lines and said N first conductive lines;

a second conductive line which is connected to other terminals of said N fourth transfer gates; and N electrical connecting means, each for electrically connecting each one of said N I/O data lines to said second conductive line as programmed.

7. A semiconductor memory device according to claim 6, wherein said N electrical connecting means comprise fusible links.

8. A semiconductor memory device according to claim 6, wherein each of said N electrical connecting means comprises:

a transfer gate transistor;

a means for applying a certain voltage to a gate electrode of said transfer gate transistor; and a fusible link connected between said gate electrode of said transfer gate transistor and a reference potential point.

9. A semiconductor memory device according to claim 6, wherein each of said N electrical connecting means comprises:

a transfer gate transistor;

a means for applying a certain voltage to gate electrode of said transfer gate transistor through an inverter;

a fusible link connected between an input of said inverter and a supply potential point; and a high resistance element connected between said input of said inverter and a reference potential point.

10. A semiconductor memory device comprising:

a memory cell array having plural memory cells arranged in rows and columns, wherein each of said columns has a first column address and a second column address assigned to it such that N columns (N being an integer not less than 2) out of N×N columns share a common first column address out of N first column addresses and that each of said N columns of a common first column address have N second column addresses respectively assigned thereto;

N I/O data lines which are simultaneously connectable to respective N columns of a common first column address or respective N columns of a common second column address;

N×N first transfer gates respectively connected between said N×N columns and associated I/O data lines with regard to first column addresses, each being closed so as to allow a flow of current therethrough when an associated column is selected in response to first column selection signals generated from first column address input signals;

N×N second transfer gates respectively connected between said N×N columns and associated I/O data lines with regard to second column addresses, each being closed so as to allow a flow of current therethrough when an associated column is selected in response to second column selection signals generated from second column address input signals;

N spare columns, each having a different second column address out of said N second column addresses assigned thereto and having a common specific first column address assignable thereto by programming a programmable column decoder;

N third transfer respectively connected between said N spare columns and said N I/O data lines, being closed so as to allow a flow of current therethrough, when said specific first column address is selected in place of N first transfer gates associated with said specific first column address in response to first column selection signals generated from first column address input signals;

N fourth transfer gates, each having a terminal connected to each one of said N spare columns, and each being closed so as to allow a flow of current therethrough when an associated spare column is selected in response to second column selection signals generated form said second column address input signals;

a conductive line which is connected to other terminals of said N fourth transfer gates;

N electrical connecting means, each for electrically connecting each one of said N I/O data lines to said conductive line as programmed; and N controls means, each for controlling N second column selection signals associated with N columns, out of said N×N columns, coupled to a common I/O data line with regard to second column addresses, wherein each of said N control means comprises: a column decoder circuit including input terminals for receiving said second column address input signals, N output terminals coupled to said N second column selection signals, and a power supply terminal; a fusible link connected between a supply potential point and said power supply terminal; N pull-down transistors having their drain terminals connected respectively to said N output terminals, having their source terminals connected to a reference potential point, and having their gate terminals connected to a disable signal line; and a means responsive to blowing said fusible link for activating said disable signal line.

* * * * *